(12) United States Patent
Lee et al.

(10) Patent No.: US 7,737,038 B2
(45) Date of Patent: Jun. 15, 2010

(54) METHOD OF FABRICATING SEMICONDUCTOR DEVICE INCLUDING PLANARIZING CONDUCTIVE LAYER USING PARAMETERS OF PATTERN DENSITY AND DEPTH OF TRENCHES

(75) Inventors: Seung-Mahn Lee, Seoul (KR); Byung-Lyul Park, Seoul (KR); MooJin Jung, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 859 days.

(21) Appl. No.: 11/567,927

(22) Filed: Dec. 7, 2006

(65) Prior Publication Data

US 2007/0196994 A1 Aug. 23, 2007

(30) Foreign Application Priority Data

Feb. 9, 2006 (KR) ...................... 10-2006-0012583

(51) Int. Cl.
*H01L 21/302* (2006.01)
(52) U.S. Cl. ...................... 438/692; 438/626; 438/631; 438/690; 438/691; 438/959
(58) Field of Classification Search ................ 438/626, 438/631, 690–692, 959
See application file for complete search history.

(56) References Cited

U.S. PATENT DOCUMENTS 6,830,504 B1 * 12/2004 Chen et al. .................... 451/57
7,016,795 B2 * 3/2006 Swedek et al. ................. 702/64
7,024,268 B1 * 4/2006 Bennett et al. ............... 700/121
2002/0055192 A1 * 5/2002 Redeker et al. ................. 438/8
2002/0164925 A1 11/2002 Swedek et al.
2007/0020918 A1 * 1/2007 Hirokawa et al. ........... 438/626

FOREIGN PATENT DOCUMENTS

JP 2003-077919 3/2003
KR 1020050104961 11/2005

OTHER PUBLICATIONS

English Abstract for Publication No. 2003-077919.
English Abstract for Publication No. 1020050104961.

* cited by examiner

*Primary Examiner*—Kevin M Picardat
*Assistant Examiner*—Bac H Au
(74) *Attorney, Agent, or Firm*—F. Chau & Associates, LLC

(57) ABSTRACT

A method of fabricating a semiconductor device includes forming a conductive layer on an insulating layer having a plurality of trenches on a semiconductor substrate, such that the conductive layer fills in the plurality of trenches formed in the insulating layer, and calculating a target eddy current value to measure an end point using parameters of a pattern density and a depth of the trenches. The method further includes planarizing the conductive layer and measuring eddy current values on the conductive layer using an eddy current monitoring system, and stopping the planarization when the measured eddy current value reaches the target eddy current value to form a planarized conductive layer having a target height on the insulating layer.

19 Claims, 3 Drawing Sheets

METHOD OF FABRICATING SEMICONDUCTOR DEVICE INCLUDING PLANARIZING CONDUCTIVE LAYER USING PARAMETERS OF PATTERN DENSITY AND DEPTH OF TRENCHES

CROSS-REFERENCE TO RELATED PATENT APPLICATION

This application claims the benefit of Korean Patent Application No, 10-2006-0012583, filed on Feb. 9, 2006, the disclosure of which is hereby incorporated by reference herein in its entirety.

BACKGROUND OF THE INVENTION

1. Technical Field

The present disclosure relates to a method of fabricating a semiconductor device, and more particularly, to a method of fabricating a semiconductor device including planarizing a conductive layer using a pattern density and a depth of trenches as parameters.

2. Description of the Related Art

The high integration attained in semiconductor devices makes the forming of metal interconnects more significant in determining the performance and reliability of the semiconductor devices. In particular, the demand for high-speed semiconductor devices is increasing such that a metal interconnect structure with a lower resistance may be required. Moreover, as the integration of the semiconductor devices is increased, the metal interconnect structure becomes more complicated. For example, a multi-layered metal interconnect structure where metal lines are arranged as multiple layers may be employed.

More specifically, copper (Cu) with a low resistivity is used as an alternative to a conventional metal interconnect which utilizes aluminum (Al). However, the use of Cu may result in a difficulty in applying patterning using photolithography and etching. Accordingly, a damascene process may be used instead by filling a Cu layer in a via hole and a trench using plating, and then planarizing the Cu layer to form a via plug and a metal line.

When forming a damascene structure, the copper layer may be planarized by Chemical Mechanical Polishing (CMP). However, if CMP is used, dishing may occur in the copper layer when planarizing. Accordingly, to decrease dishing, CMP may be performed in multiple steps. For example, initially, CMP is performed in a fast planarization condition. Then, planarization is performed under a condition that incurs no dishing. Nonetheless, with the above multiple step CMP process, detecting an end point to adjust the Cu layer prior to a final CMP step maybe difficult.

For example, an end point detection system using optic and eddy current monitoring is described in U.S. Patent Application Publication No, US 2002/0164925. However, use of this conventional eddy current monitoring may result in a difficulty in which the end point is varied in accordance with a pattern density or thickness of via holes or trenches. The above difficulty may occur because a Cu layer within the via hole or the trench is apt to be related to the eddy current as well as the Cu layer on an insulating layer.

If the end point is changed as described above, the thickness of the Cu layer that will be removed in the final CMP may be changed. Therefore, it may be difficult to control the final CMP. Thus, as a result, after completing CMP, Cu residues may remain on the insulating layer or the insulating layer may be excessively removed to result in the production of an inferior semiconductor device. Moreover, the Cu residues may result in the reliability of a semiconductor device being deteriorated. In addition, the target thickness of the final CMP may also be varied every time to degrade the productivity of the semiconductor fabrication process.

Thus, there is a need for a method of fabricating a semiconductor device to planarize a conductive layer regardless of the pattern density and the depth of trenches, and to increase the productivity thereof.

SUMMARY OF THE INVENTION

The exemplary embodiments of the present invention provide a method of fabricating a semiconductor device to planarize a conductive layer regardless of a pattern density and a depth of trenches and to increase productivity thereof.

In accordance with an exemplary embodiment of the present invention, a method of fabricating a semiconductor device is provided. The method includes forming a conductive layer on an insulating layer having a plurality of trenches on a semiconductor substrate, such that the conductive layer fills in the plurality of trenches formed in the insulating layer, and calculating a target eddy current value to measure an end point using parameters of a pattern density and a depth of the trenches. The method further includes planarizing the conductive layer and measuring eddy current values on the conductive layer using an eddy current monitoring system and stopping the planarization when the measured eddy current value reaches the target eddy current value to form a planarized conductive layer having a target height on the insulating layer.

In this case the calculating the target eddy current value may be performed receiving the pattern density and the depth of the plurality of trenches in the insulating layer. Then, a relation expression with respect to the eddy current value and the height of the conductive layer set to a plurality of reference trenches is received. After correcting the relation expression with respect to the eddy current value and the height of the conductive layer using differences of the pattern densities and the depths of the plurality of trenches and the reference trenches, the target eddy current value corresponding to the target height of the conductive layer is obtained from the corrected relation expression.

In accordance with another exemplary embodiment of the present invention, a method of fabricating a semiconductor device is provided. The method includes forming an insulating layer having a plurality of trenches on a semiconductor substrate, forming a barrier layer on the insulating layer, forming a conductive layer on the barrier layer to fill the plurality of trenches in the insulating layer calculating a target eddy current value to measure an end point using parameters of a pattern density and a depth of the plurality of trenches, first planarizing the conductive layer, and measuring an eddy current on the conductive layer using an eddy current monitoring system. The method further including stopping the first planarizing when the measured eddy current value reaches the target eddy current value to form a first planarized conductive layer having a target height on the insulating layer, and secondarily planarizing the first planarized conductive layer to expose the barrier layer.

In this case, the method further includes third planarizing the barrier layer and the secondarily planarized conductive layer to expose the insulating layer.

BRIEF DESCRIPTION OF THE DRAWINGS

Exemplary embodiments of the present invention can be understood in more detail from the following description taken in conjunction with the accompanying drawings in which.

DETAILED DESCRIPTION OF THE EXEMPLARY EMBODIMENTS

Figure 1:
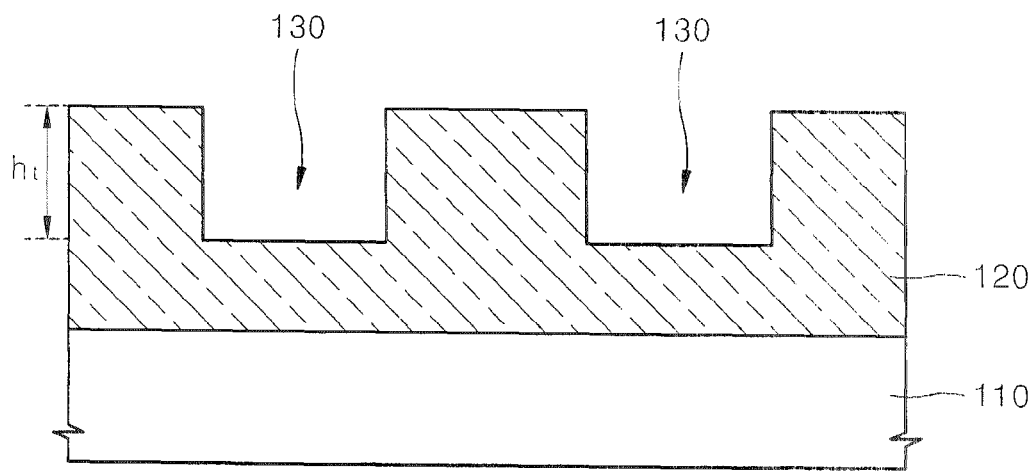
FIGS. 1 through 5 are cross-sectional views illustrating a method of fabricating a semiconductor device according to an exemplary embodiment of the present invention.

The present invention will now be described more fully with reference to the accompanying drawings, in which exemplary embodiments of the invention are shown. The invention may, however, be embodied in many different forms and should not be construed as being limited to the exemplary embodiments set forth herein. Like reference numerals in the drawings denote like elements.

FIGS. 1 through 5 are cross-sectional views illustrating a method of fabricating a semiconductor device according to an exemplary embodiment of the present invention. The semiconductor device according to exemplary embodiments of the present invention may be, e.g., a logic device, including various integrated circuits. As another example, the semiconductor device may include a memory device such as for example, a dynamic random access memory (DRAM) device, a static random access memory (SRAM) device, a flash memory device, a ferroelectric memory device and a phase-change memory device.

Referring to FIG. 1, an insulating layer 120 having a plurality of trenches 130 is formed on a semiconductor substrate 110. For example, an insulating material layer is formed on the semiconductor substrate 110 and the plurality of trenches 130 are formed in the insulating material layer using, for example, photolithography and etching. The semiconductor substrate 110 may be, e.g., a silicon wafer or a silicon-germanium wafer. The insulating layer 120 may include, e.g., silicon oxide or silicon nitride.

Trenches 130 have a predetermined pattern density, e.g., $P_d$, and a predetermined depth $h_t$ from a surface of the insulating layer 120. The pattern density $P_d$ may denote a ratio of the trenches 130 occupied in the semiconductor substrate 110 as a percentage (%). In exemplary embodiments of the present invention, the trenches 130 may include a groove or a hole structure formed from the surface of the insulating layer 120. Accordingly, the trenches 130 are not limited to their designation, and may include a dual damascene structure that connects a via-hole or a contact to a via-hole or a trench.

Furthermore, when a logic device is to be formed, a plurality of transistors may be formed within or on the semiconductor substrate 110. When a memory device is formed, a plurality of transistors and storage nodes may be formed within or on the semiconductor substrate 110. A structure and a method of fabricating the transistors and the storage nodes are well known in the art, and thus will not be described herein.

Figure 2:
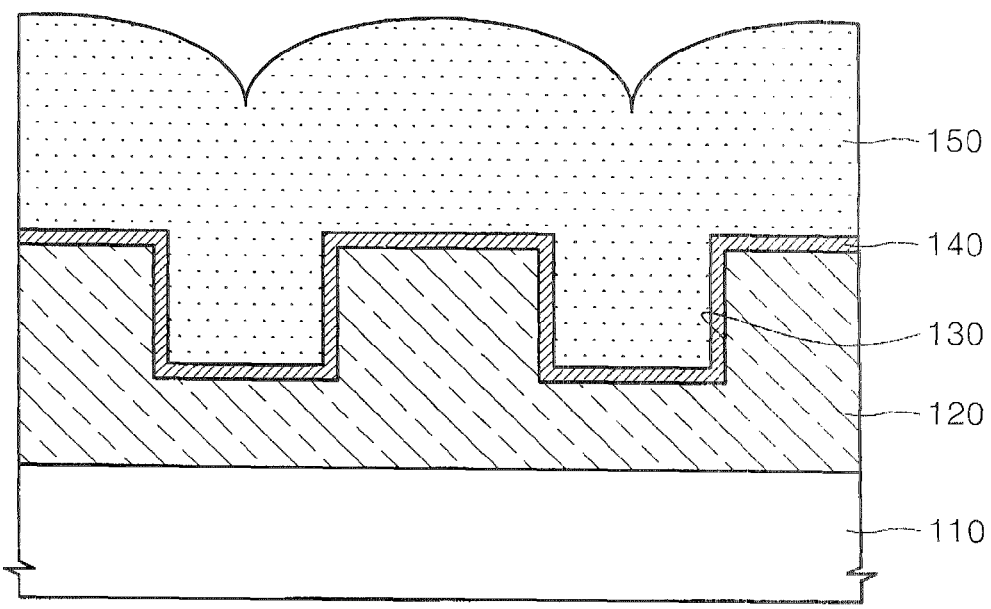

Referring to FIG. 2, a barrier layer 140 is formed on the insulating layer 120. For example, the barrier layer 140 may be formed, for example, using Physical Vapor Deposition (PVD) or Chemical Vapor Deposition (COV). The barrier layer 140 may includes e.g. tantalum (Ta), tantalum nitride (TaN), titanium (Ti), and titanium nitride (TiN), tungsten (W) or a composite layer of these materials.

Then, a conductive layer 150 may be formed on the barrier layer 140 to be filled in the trenches 130 in the insulating layer 120. For example, the conductive layer 150 may include a copper (Cu) layer. The Cu layer may be formed by, for example, electro-plating. Moreover, before electro-plating, a Cu seed layer may be formed on the barrier layer 140.

According to a modification of the exemplary embodiments of the present invention, the barrier layer 140 may not be formed, but the conductive layer 150 may be formed on the insulating layer 120. According to another modification of the exemplary embodiments of the present invention, another material layer may be interposed between the insulating layer 120 and the conductive layer 150.

Figure 3:
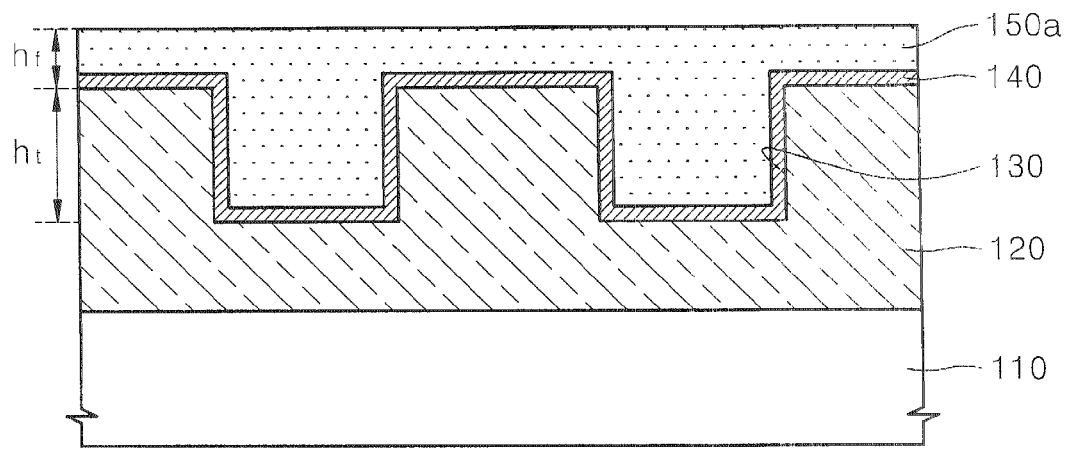

Referring to FIG. 3 the conductive layer (150 of FIG. 2) is planarized, so that a first-planarized conductive layer 150a is formed. The conductive layer 150a is controlled to have a target height $h_f$ over the barrier layer 140. Although the target height $h_f$ is illustrated by setting the barrier layer 140 as a reference the insulating layer 120 may be a reference. For example, the first planarization may be performed by CMP. Because the occurrence of dishing in CMP is not a concern for the first planarization, CMP may be performed under a high pressure condition to quickly remove the conductive layer (150 of FIG. 2).

In connection with CMP for the first planarization it is significant to allow the conductive layer 150a to have a consistent target thickness $h_f$ regardless of the pattern density $P_d$ and the depth $h_t$. This is because, if the target thickness $h_t$ of the conductive layer 150a is inconsistent in the first planarization, it may be difficult to control the succeeding second planarization.

For example, CMP for the first planarization is controlled by an end point detection using an eddy current monitoring system. A structure of the eddy current monitoring system may refer to, e.g., U.S. Patent Application Publication No. US 2002/0164925. The eddy current monitoring system applies a predetermined magnetic field to the conductive layer 150a, and monitors an eddy current induced by the conductive layer 150a.

For example, using the pattern density $P_d$ and the depth $h_f$ of the trenches 130 as parameters to compensate for an influence exerted by the conductive layer 150a portion within the trenches 130, a predetermined target eddy current to measure an end point is calculated. While carrying out the first planarization, the eddy current on the conductive layer 150a is measured. When the measured eddy current reaches the target eddy current the first planarization is stopped. By doing so, the conductive layer 150a having a consistent target height $h_f$ can be formed free from the pattern density $P_d$ and the depth $h_f$ of the trenches 130.

Figure 6:
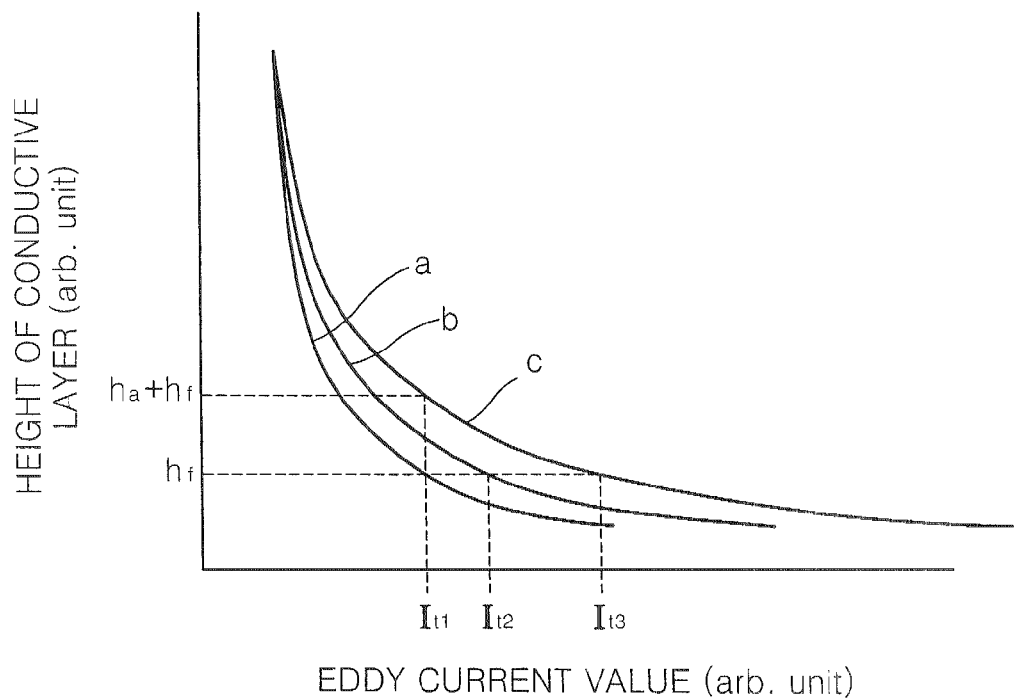
FIG. 6 is graphs illustrating a relation between eddy current values and height of a conductive layer to measure an end point of planarizing.

Calculating the target eddy current will be described with reference to FIG. 6. Referring to FIGS. 3 and 6, as the height of the conductive layer 150a is lowered, the eddy current is increased. The height of the conductive layer 150a denotes the height on the insulating layer 120.

Graphs a, b and c respectively display results with respect to the trenches 130 having different pattern densities or depths. In this case, the pattern densities or the depths of the trenches 130 are increased in the order of the graph c, the graph b and the graph a. The target eddy current value corresponding to the target height $h_f$ of the conductive layer 150a is $I_{t1}$ for the curved line a, $I_{t2}$ for the curved line b, and $I_{t3}$ for the curved line c (that is, $I_{t1} < I_{t2} < I_{t3}$). In other words, as the pattern density or the depth of the trenches 130 is increased, the target eddy current value is decreased.

This is because, if the pattern density or the depth of the trenches 130 is increased, the relative importance of the conductive layer 150a within the trenches 130 is increased. Therefore, even if the conductive layer 150a having the same thickness is left on the insulating layer 120, a bulk of the conductive layer 150a of inducing the eddy current is increased when the pattern density or the depth of the trenches 130 are increased. Consequently, the eddy current is decreased in inverse proportion thereto.

In this case, a reference graph, e.g., the graph c, is already known, remaining graphs, e.g., the graph a or b, can be obtained. For example, reference graph c is obtained with respect to a reference trench, and corresponds to an exemplary embodiment of the present invention.

First, the pattern density and the depth of the trenches 130 in the insulating layer 120 are received. The pattern density of the trenches 130 is designated by $P_d$ and the depth is designated by $h_t$. Then, a relation expression with respect to the eddy current value and the height of the conductive layer corresponding to the reference graph c are received. For example, providing that the reference graph c satisfies y=f(x). Here, the x-axis denotes the eddy current value, and the y-axis denotes the height of the conductive layer. To simplify calculation, it is considered that the pattern density or the depth of the reference trench is zero. The relation expression with respect to the reference graph c can be easily obtained by measuring the height and the eddy current of the conductive layer while performing the first planarization of the conductive layer on the insulating layer with no trench.

Subsequently, the relation expression with respect to the eddy current and the height of the conductive layer of the reference graph c, e.g., y=f(x), is corrected to obtain a relation expression with respect to the graph a obtained as y=g(x). For example, the total bulk of the conductive layer 150a portion within the trenches 130 obtained by a conversion thickness $h_a$ on the semiconductor substrate 110 as a reference is written as:

$$h_a = h_t \times P_d / 100 \quad \text{[Equation 1]}$$

According to the [Equation 1], the height of the conductive layer 150a on the insulating layer 120 of the graph c with respect to the same eddy current value may be less than the height of the conductive layer of the graph a as many as the conversion thickness $h_a$. Thus, a relation expression with respect to the graph a is written as:

$$y = g(x) = f(x) - h_a = f(x) - h_t \times P_d / 100 \quad \text{[Equation 2]}$$

That is, the relation expression of the graph c is corrected using the pattern density $P_d$ and the depth $h_t$ of the trenches 130 as the parameters, thereby obtaining the relation expression with respect to the graph a. Then, the target eddy current value $I_{t1}$ corresponding to the target height $h_f$ of the conductive layer 150a can be obtained from the corrected relation expression, e.g., y=g(x).

Although the pattern density or the depth of the reference trench is zero in the above equation, it is apparent that the relation expression with respect to the eddy current and the height of the conductive layer may be obtained using the difference between the thickness and the eddy current when the pattern density or the depth of the reference trench is not zero.

Figure 4:
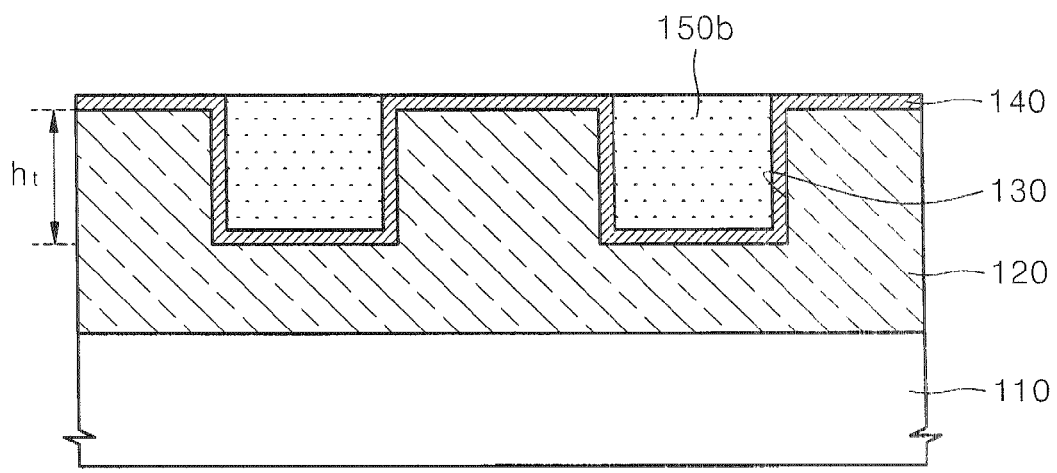

Referring to FIG. 4, the conductive layer (150a of FIG. 3) first planarized is then secondarily planarized to expose the barrier layer 140 to form a secondarily planarized conductive layer 150b. For example, the secondary planarization may use CMP. CMP for the secondary planarization may be performed under a pressure lower than that of CMP for the first planarization so as not to produce dishing. Therefore, the first planarization may be referred to as bulk CMP, and the secondary planarization may be referred to as soft landing CMP.

In the secondary planarization, the end point may be detected, using an optical end point detector. As the conductive layer 150b and the barrier layer 140 display greatly different light emitting characteristics, the optical end point detector can monitor a point of exposing the barrier layer 140. Meanwhile in the first planarization, the conductive layer (150a of FIG. 3) is detected on the entire surface of the semiconductor substrate 110, so that it may be difficult to use the optical end point detector.

According to another modification of the exemplary embodiments of the present invention, the secondary planarization may be controlled by adjusting the CMP time regularly. This is because the target height $h_t$ on the insulating layer 120 of the first planarized conductive layer (150a of FIG. 3) is consistent. The barrier layer 140 can be exposed for a predetermined time by controlling the time.

According to the exemplary embodiments of the present invention, the controlling of the secondary planarization is easier than with conventional methods. Furthermore, conventionally occurring residue of the conductive layer 150b which remains on the insulating layer 120 caused by the insufficient control of the secondary planarization may be prevented by the exemplary embodiments of the present invention. Furthermore, with the exemplary embodiments of the present invention, the height of the first planarized conductive layer (150a of FIG. 3) is consistently controlled to regularly adjust the time elapsed for the secondary CMP with the relatively low removing speed, thereby improving productivity of CMP.

Figure 5:
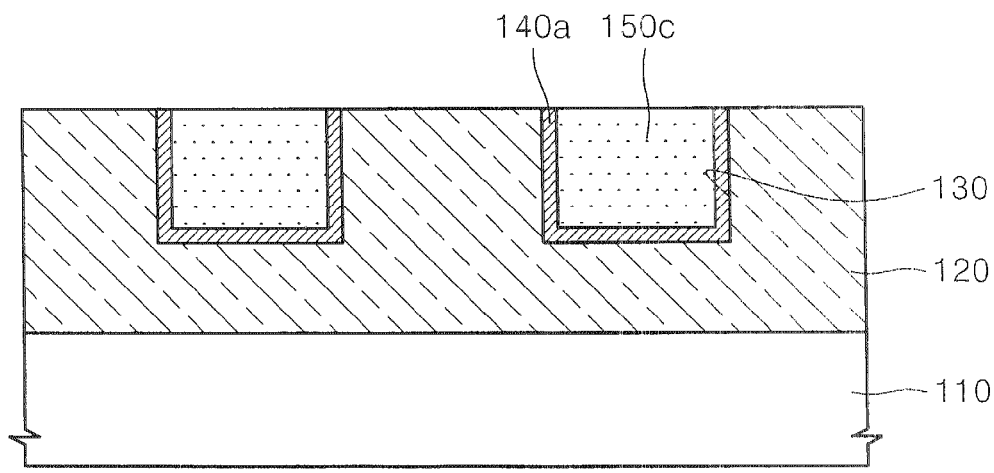

Referring to FIG. 5, the barrier layer (140 of FIG. 4) and the conductive layer (150b of FIG. 4) are thirdly planarized to expose the insulating layer 120, thereby further forming a barrier layer 140b within the thirdly planarized conductive layer 150c and the trenches 130. For example, the third planarization may use CMP. The CMP for the third planarization may have a condition selected to easily remove the barrier layer 140 of FIG. 4 or the insulating layer 120. For example, CMP for the third planarization may be carried out under the condition of removing an oxide layer.

The conductive layer 150c may be a via plug or a metal interconnect connected to an underlying transistor. Moreover, the conductive layer 150c may have a damascene structure where the via plug or the metal interconnect are connected. In the exemplary embodiments of the present invention, the structure of the conductive layer 150c is not restricted to the single damascene or a dual damascene structure.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A method of fabricating a semiconductor device comprising:
   forming a conductive layer on an insulating layer having a plurality of trenches on a semiconductor substrate, such that the conductive layer fills in the plurality of trenches formed in the insulating layer;
   calculating a target eddy current value to measure an end point using parameters of a pattern density and a depth of the trenches;

planarizing the conductive layer and measuring eddy current values on the conductive layer using an eddy current monitoring system, and stopping the planarization when the measured eddy current value reaches the target eddy current value to form a planarized conductive layer having a target height on the insulating layer.

2. The method of claim 1, wherein the calculating of the target eddy current value comprises:

receiving the pattern density and the depth of the plurality of trenches in the insulating layer;

receiving a relation expression with respect to the eddy current value and the height of the conductive layer set to a plurality of reference trenches;

correcting the relation expression with respect to the eddy current value and the height of the conductive layer using differences of the pattern densities and the depths of the plurality of trenches and the reference trenches; and obtaining the target eddy current value corresponding to the target height of the conductive layer from the corrected relation expression.

3. The method of claim 2, wherein the correcting of the relation expression with respect to the eddy current value and the height of the conductive layer comprises:

converting the differences of the pattern densities and the depths of the plurality of trenches and the reference trenches in terms of a thickness of the conductive layer on the semiconductor substrate; and adding/subtracting a conversion thickness of the conductive layer to/from the relation expression.

4. The method of claim 3, wherein the pattern density and the depth of the plurality of reference trenches are zero.

5. The method of claim 3, wherein the conversion thickness of the conductive layer is increased and the differences of the pattern densities and the depths of the plurality of trenches and the reference trenches are increased.

6. The method of claim 1, wherein, the pattern density or the depth of the plurality of the trenches is increased, and the target eddy current value is decreased with respect to the same target height of the conductive layer.

7. The method of claim 1, wherein the conductive layer comprises a copper layer.

8. The method of claim 1, wherein planarization is carried out using Chemical mechanical Polishing (CMP).

9. A method of fabricating a semiconductor device comprising:

forming an insulating layer having a plurality of trenches on a semiconductor substrate;

forming a barrier layer on the insulating layer;

forming a conductive layer on the barrier layer to fill the plurality of trenches in the insulating layer;

calculating a target eddy current value to measure an end point using parameters of a pattern density and a depth of the plurality of trenches;

first planarizing the conductive layer, and measuring an eddy current on the conductive layer using an eddy current monitoring system;

stopping the first planarizing when the measured eddy current value reaches the target eddy current value to form a first planarized conductive layer having a target height on the insulating layers; and secondarily planarizing the first planarized conductive layer to expose the barrier layer.

10. The method of claim 9, wherein a point of exposing the barrier layer in the secondary planarizing is detected using an optical end point detector.

11. The method of claim 9, wherein the first planarizing and the secondary planarizing are performed using Chemical Mechanical Polishing (CMP).

12. The method of claim 11, wherein the first planarizing is performed under a pressure condition higher than that of the secondary planarizing.

13. The method of claim 9, further comprising third planarizing the barrier layer and the secondarily planarized conductive layer to expose the insulating layer.

14. The method of claim 13, wherein the first, second and third planarizing are performed using Chemical Mechanical Polishing (CMP).

15. The method of claim 9, wherein the calculating the of the target eddy current value comprises:

receiving a pattern density and a depth of the plurality of trenches in the insulating layer;

receiving a relation expression with respect to the eddy current value and the height of the conductive layer set with respect to a plurality of reference trenches;

correcting a relation expression with respect to the eddy current value and the height of the conductive layer using differences of the pattern densities and the depths of the plurality of trenches and the reference trenches; and obtaining the target eddy current value corresponding to the target height of the conductive layer from the corrected relation expression.

16. The method of claim 15, wherein the correcting of the relation expression with respect to the eddy current value and the height of the conductive layer comprises:

converting the differences of the pattern densities and the depths of the plurality of trenches and the reference trenches in terms of a thickness of the conductive layer on the semiconductor substrates; and adding/subtracting a conversion thickness of the conductive layer to/from the relation expression.

17. The method of claim 16, wherein the pattern density and the depth of the plurality of reference trenches are zero.

18. The method of claim 16, wherein the conversion thickness of the conductive layer is increased and the differences of the pattern densities and the depths of the plurality of trenches and the reference trenches are increased.

19. The method of claim 9, wherein the conductive layer comprises a copper layer.

* * * * *